United States Patent [19]

Mita

[11] Patent Number: 5,283,460

[45] Date of Patent: Feb. 1, 1994

[54] OPTICAL SEMICONDUCTOR DEVICE

[75] Inventor: Keizi Mita, Oizumimachi, Japan

[73] Assignee: Sanyo Electric Co., Ltd., Moriguchi, Japan

[21] Appl. No.: 834,611

[22] Filed: Feb. 12, 1992

[30] Foreign Application Priority Data

Feb. 27, 1991 [JP] Japan .................. 3-032929

[51] Int. Cl.$^5$ .................. H01L 27/14; H01L 29/72; H01L 27/02; H01L 29/90
[52] U.S. Cl. .................. 257/432; 257/446; 257/461; 257/544; 257/565
[58] Field of Search .................. 257/432, 446, 461, 544, 257/552, 565

[56] References Cited

FOREIGN PATENT DOCUMENTS 1205564 8/1989 Japan .

*Primary Examiner*—Mark V. Prenty
*Attorney, Agent, or Firm*—Thomas R. Morrison

[57] ABSTRACT

An optical semiconductor includes a photo diode integrated with a transistor built on first and second epitaxial layers grown on a substrate, the first epitaxial layer is grown on the substrate from intrinsic material. The second epitaxial layer is grown doped on the first epitaxial layer. A separating area divides the optical semiconductor into first and second isolated islands. The separating area is made up of a lower separating area, a middle separating area and an upper separating area united to form a single separating area. The lower separating area is diffused at least upward from an interface between the substrate and the first epitaxial area. The middle separating area is diffused both downward and upward from an interface between the first and second epitaxial layers. The upper separating area is diffused downward from the surface of the second epitaxial layer. The photo diode is formed in the first island area, and the transistor is formed in the second island area. A counterdoped region in the surface of the substrate, at least below the first island, expands the depth of the depletion region of the photo diode. The separating area enters the substrate to a depth corresponding to the depth of the counterdoped region.

18 Claims, 7 Drawing Sheets

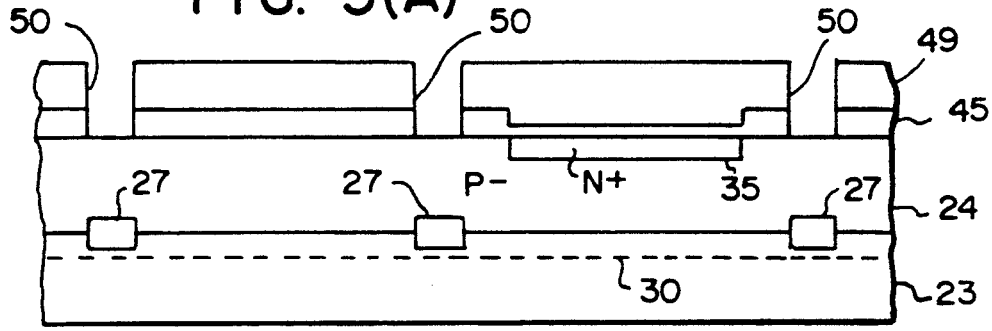
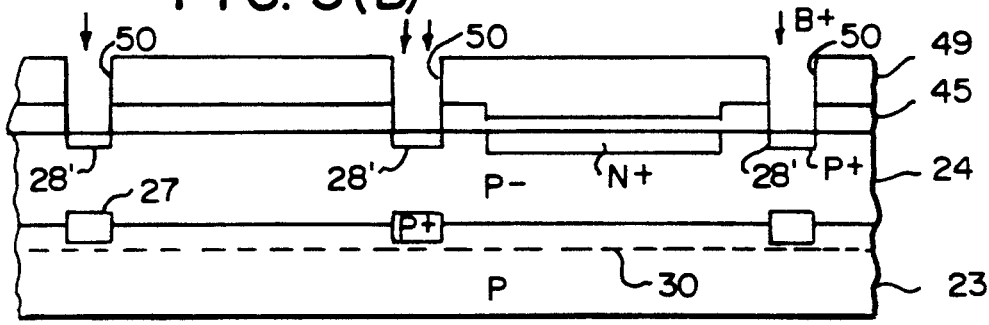
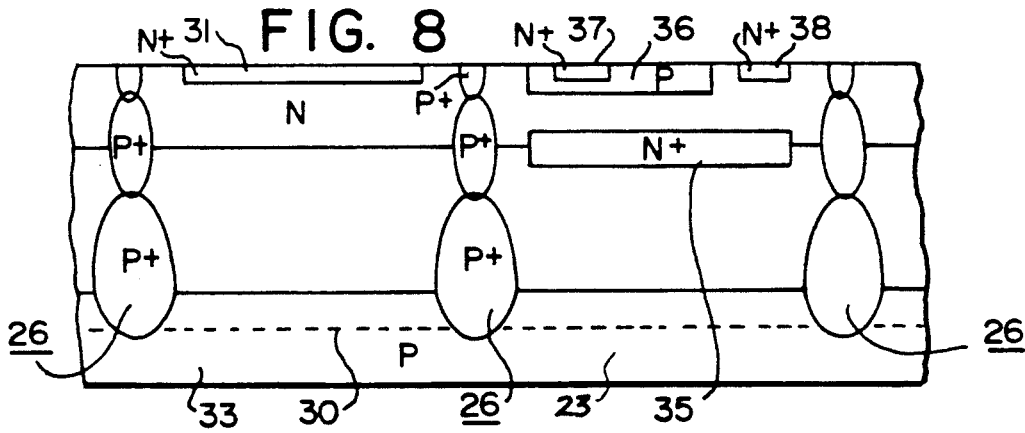
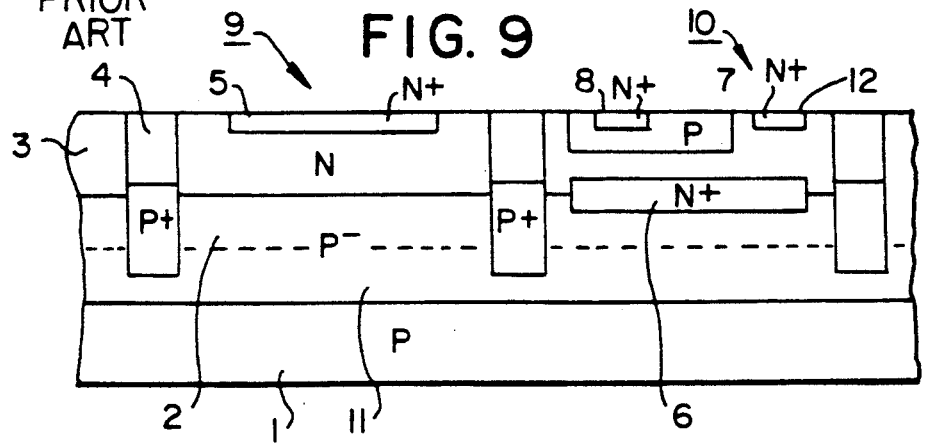

OPTICAL SEMICONDUCTOR DEVICE

BACKGROUND OF THE INVENTION

This invention relates to integrated circuits and, more specifically, to an optical semiconductor device having, integrally formed therein, a photo diode and a bipolar transistor.

Compared to a hybrid IC combined with a separately produced light receiving element and external circuit elements, a monolithic optical semiconductor device, integrally combining a light receiving element and a peripheral circuit, can be produced at a lower cost and is relatively immune to noise from external electromagnetic fields.

Referring to FIG. 9, a conventional optical semiconductor device is disclosed in, for example, Japanese Laid-open Patent Publication No. 1-205564. A P-type semiconductor substrate 1, has epitaxially grown thereon a P-type epitaxial layer 2. An N-type epitaxial layer 3 is epitaxially grown on epitaxial layer 2. A plurality of P+-type separating areas 4 separate epitaxial area 3, and contiguous upper portions of epitaxial layer 2 into isolated islands. A first island is used to form a photo diode 9. A second island is used to form an NPN transistor 10.

Photo diode 9 includes an N+-type diffusion area in its upper surface. An N+-type buried layer 6 spans the interface between epitaxial layers 2 and 3 in the island forming transistor 10. The portion of epitaxial layer 3 in transistor 10 functions as the collector thereof. A P-type base area 7 is disposed in an upper surface of transistor 10. An N+-type N+-type emitter area is disposed in an upper surface of base area 7. An N+-type type collector contact area 12 is disposed in the upper surface of transistor 10 outside base area 7.

Photo diode 9 is biased to form a PN junction between P-type epitaxial layer 2 and N-type epitaxial layer 3. N+-type diffusion area 5 serves as a cathode of photo diode 9. Separating area 4 serves as an anode of photo diode 9.

An accelerated electric field is formed in NPN transistor 10 by an auto-doped layer 11 in epitaxial layer 2 which became autodoped by diffusion of P-type carriers from substrate 1 during epitaxial growth and heat treatment Autodoped layer 11 retards the movement of carriers originating below the depletion region.

To obtain a high speed response of photo diode 9, the depletion region is widened to restrain the movement of carriers occurring outside the depletion region. In the structure in FIG. 9, automatic doping layer 11 overlaps P-type epitaxial layer 2. This overlap results in an increased concentration of impurities and an enlargement of the depletion region.

Epitaxial growth requires processing in a closed vessel into which gasses are fed to grow the desired layer, and to introduce the desired amount of impurities. During growth of P-type epitaxial layer 2, the closed vessel becomes contaminated with the P-type impurities. If an attempt were made to grow N-type epitaxial layer 3 in the same closed vessel used to grow P-type epitaxial layer 2, the P-type contaminants in the vessel would enter epitaxial layer 3 in such amounts that it would be difficult or impossible to attain the desired properties in epitaxial layer 3.

As a consequence of the contamination of the vessel by P-type impurities during epitaxial growth of epitaxial layer 2, the device must be removed physically from the vessel after epitaxial layer 2 is formed, and placed in a clean vessel for growth of N-type epitaxial layer 3. This requirement for removing and reinstalling the workpiece during processing interferes with production. Thus, the same epitaxial growing device cannot be used to produce the prior-art device of FIG. 9.

OBJECTS AND SUMMARY OF THE INVENTION

Accordingly, it is an object of the present invention to provide an integrated photo diode and a transistor which overcomes the drawbacks of the prior art.

It is a further object of the invention to provide an integrated photo diode and a transistor in which epitaxial layers can be formed in the same vessel without requiring removal between the growing of layers.

It is a still further object of the invention to provide an integrated circuit having a photo diode and a transistor in which the photo diode cathode and the transistor emitter are formed of the same material in the same process steps.

Briefly stated, the present invention provides an optical semiconductor that includes a photo diode integrated with a transistor built on first and second epitaxial layers grown on a substrate, the first epitaxial layer is grown on the substrate from intrinsic material. The second epitaxial layer is grown doped on the first epitaxial layer. A separating area divides the optical semiconductor into first and second isolated islands. The separating area is made up of a lower separating area, a middle separating area and an upper separating area united to form a single separating area. The lower separating area is diffused at least upward from an interface between the substrate and the first epitaxial area. The middle separating area is diffused both downward and upward from an interface between the first and second epitaxial layers. The upper separating area is diffused downward from the surface of the second epitaxial layer. The photo diode is formed in the first island area, and the transistor is formed in the second island area. A counterdoped region in the surface of the substrate, at least below the first island, expands the depth of the depletion region of the photo diode. The separating area enters the substrate to a depth corresponding to the depth of the counterdoped region.

According to an embodiment of the invention, there is provided an optical semiconductor device comprising: a semiconductor substrate of a first conductivity type, a first epitaxial layer epitaxially grown of intrinsic material on a surface of the semiconductor substrate, a second epitaxial layer of a reverse conductivity type epitaxially grown on a surface of the first epitaxial layer, a separating area of a second conductivity type dividing the first and second epitaxial layers into at least first and second island areas, the separating area including a lower separating area, a middle separating area and an upper separating area, all congruent and joined together, the lower separating area being diffused upward from a surface of the substrate, the upper separating area being diffused downward from a surface of the second epitaxial area, the middle separating area being centered in an interface between the first and second epitaxial layers, being diffused downward to connect to the lower separating area, and being diffused upward to connect to the upper separating area, a diffusion area of a reverse conductivity in a surface of the second epitaxial layer in the first island area, a first electrode of a photo diode contacting the diffusion area, a second electrode of the photo diode contacting the separating area, a buried layer of a reverse conductivity at an interface between the first and second epitaxial layers in the second island area, and a base area of a conductivity type on an upper surface of the second epitaxial layer in the second island area, and an emitter area of a reverse conductivity type in an upper surface of the base area.

According to a feature of the invention, there is provided an optical semiconductor device comprising: a semiconductor substrate of a conductivity type, a first epitaxial layer epitaxially grown of intrinsic semiconductor material on a surface of the semiconductor substrate, a second epitaxial layer of a reverse conductivity type epitaxially grown on a surface of the first epitaxial layer, a separating area of a conductivity type dividing the first and second epitaxial layers into at least first and second island areas, offsetting impurities of a reverse conductivity type for offsetting a concentration of impurities in the semiconductor substrate at least in the first island, the separating area including a lower separating area, a middle separating area and an upper separating area, the lower separating area being diffused from the surface of the substrate to a midst of first epitaxial layer, the middle separating area being diffused downward to unite with the lower separating area and in an upward direction from an interface between the first and second epitaxial layers, the upper separating area being diffused downward from a surface of the second epitaxial layer to unite with the middle separating area, a diffusion area of a reverse conductivity type of a photo diode in a surface of the first island area, a first electrode of the photo diode contacting the diffusion area, a second electrode of the photo diode contacting the separating area, a buried layer of a reverse conductivity type at an interface between the first and second epitaxial layers, and a base area of a conductivity type in a surface of the second island area, an emitter area of a reverse conductivity type in a surface of the base area.

According to a further feature of the invention, there is provided a semiconductor product comprising: a substrate, a first epitaxial layer grown on the substrate, a second epitaxial layer grown on the first epitaxial layer, a separating area defining first and second isolated island areas, the separating area including a lower separating area, a middle separating area and an upper separating area, the lower separating area being diffused at least upward from an interface between the substrate and the first epitaxial layer, the middle separating area being diffused downward from an interface between the first and second epitaxial layers into contact with the lower separating area, and being diffused upward, and the upper separating area being diffused downward from a surface of the second epitaxial layer into contact with the middle separating area, whereby the lower, middle and upper separating areas unite to form the separating area.

According to a still further feature of the invention, there is provided a method for producing a semiconductor photo diode comprising: forming a substrate of a first conductivity type, epitaxially growing a first epitaxial layer from intrinsic semiconductor material on the substrate, epitaxially growing a second epitaxial layer of an opposite conductivity type on the first epitaxial layer, forming a diffusion area on a surface of the second epitaxial layer, forming a separating area surrounding the photo diode, the step of forming a separating area including forming a lower separating area diffused at least upward from an interface between the substrate and the first epitaxial layer, forming a middle separating area diffused downward from an interface between the first epitaxial layer and the second epitaxial layer, and diffused upward, and forming an upper separating area diffused downward from a surface of the second epitaxial layer into contact with the middle separating area, connecting a first contact of the photo diode to the diffusion area, and connecting a second contact of the photo diode to the separating area.

According to a still further feature of the invention, there is provided a method for producing a transistor comprising: forming a substrate of a first conductivity type, epitaxially growing a first epitaxial layer from intrinsic semiconductor material on the substrate, epitaxially growing a second epitaxial layer of an opposite conductivity type on the first epitaxial layer, diffusing a buried layer of a second conductivity type at an interface between the first epitaxial layer and the second epitaxial layer, forming a separating area surrounding the transistor, the step of forming a separating area including forming a lower separating area diffused at least upward from an interface between the substrate and the first epitaxial layer, forming a middle separating area diffused downward from an interface between the first epitaxial layer and the second epitaxial layer, and diffused upward, and forming an upper separating area diffused downward from a surface of the second epitaxial layer into contact with the middle separating area, forming a base area of the first conductivity type in a surface of the second epitaxial lay ., and forming an emitter area in a surface of the base area.

According to a still further feature of the invention, there is provided a method for producing a semiconductor photo diode integrated with a transistor comprising: forming a substrate of a first conductivity type, epitaxially growing a first epitaxial layer from intrinsic semiconductor material on the substrate, epitaxially growing a second epitaxial layer of an opposite conductivity type on the first epitaxial layer, forming a separating area dividing at least the first and second epitaxial layers into first and second isolated islands diode, the step of forming a separating area including forming a lower separating area diffused at least upward from an interface between the substrate and the first epitaxial layer, forming a middle separating area diffused downward from an interface between the first epitaxial layer and the second epitaxial layer, and diffused upward, and forming an upper separating area diffused downward from a surface of the second epitaxial layer into contact with the middle separating area, forming a diffusion area on a surface of the second epitaxial layer in the first island, connecting a first contact of the photo diode to the diffusion area, connecting a second contact of the photo diode to the separating area, forming a buried layer of a second conductivity type in the second island at an interface between the first and second epitaxial layers, forming a base area in a surface of the second island, and forming an emitter area in a surface of the base area.

The above, and other objects, features and advantages of the present invention will become apparent from the following description read in conjunction with the accompanying drawings, in which like reference numerals designate the same elements.

BRIEF DESCRIPTION OF THE ACCOMPANYING DRAWINGS

FIG. 1 is a cross section of an optical semiconductor device according to this invention.

FIGS. 2(A)-2(E), 3(A)-3(C), 4(A)-4(D), 5(A)-5(C), 6(A)-6(D), 7(A)-7(D) and 8 are cross sections to which reference will be made in describing the process for producing the optical semiconductor device of FIG. 1.

FIG. 9 is a cross section of an optical semiconductor device according to the prior art.

DETAILED DESCRIPTION OF THE PREFERRED EMBODIMENTS

Figure 1:
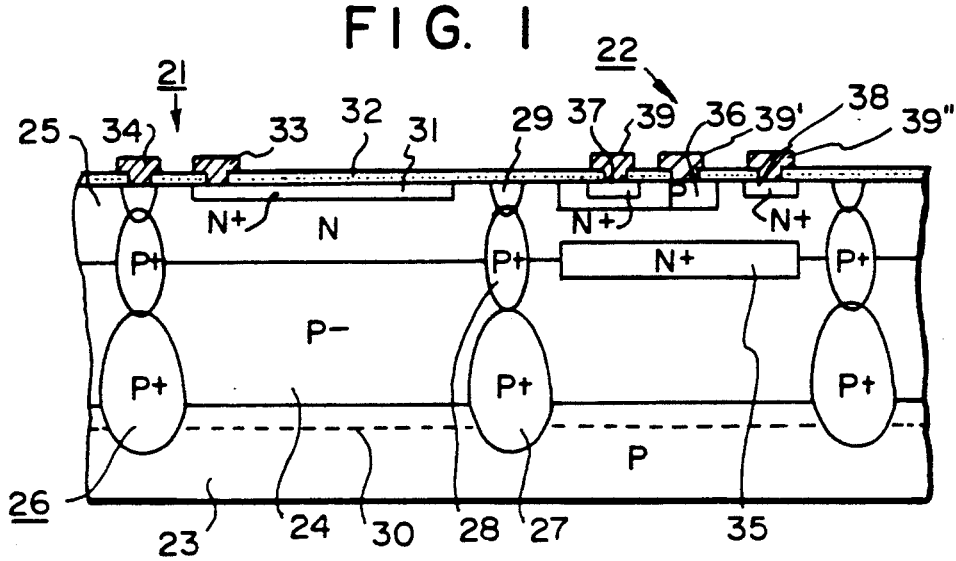

Referring to FIG. 1 a photo diode 21 and an NPN transistor 22 are integrated into a single device. A P-type single crystal silicon semiconductor substrate 23 includes an ion-implanted counterdoped region 30 that is doped with phosphorus. An intrinsic first epitaxial layer 24 is epitaxially grown by vapor deposition on substrate 23 to a thickness of 5-20 microns.

A second epitaxial layer 25 is grown by vapor deposition on first epitaxial layer 24 to a thickness of 4 to 6 microns. Second epitaxial layer 25 is doped with phosphorus during growth.

Substrate 23 has a lower concentration of impurities than is normally provided in an ordinary bipolar IC, resulting in a resistivity of 40 to 60 ohm.cm.

The resistivity of first epitaxial layer 24 is initially from 1000 to 1500 ohm.cm at the time of growth, but changes to 200 to 1500 ohm.cm. due to diffusion of impurities thereinto during subsequent heat treatment. Epitaxial layer 24 forms a central diffusion area.

Second epitaxial layer 25 is doped to a resistivity of 0.5-3.0 ohm.cm using phosphorus at a concentration of about $10^{15}$ phosphorus atoms per $cm^3$.

First and second epitaxial layers 24 and 25 are electrically isolated by a separating area 26 into a section for photo diode 21 and a section for NPN transistor 22. Separating area 26 is formed of a lower separating area 27 diffused above and below the interface between substrate 23 and first epitaxial layer 24, a middle separating area 28 diffused above and below the interface between first epitaxial layer 24 and second epitaxial layer 25, and an upper separating area 29 diffused downward from a surface of second epitaxial layer 25. Separating areas 27, 28 and 29 overlap to become joined in forming a single separating area 26 that divides epitaxial layers 24 and 25 into isolated island areas. In addition, lower separating area 26 is diffused downward into substrate 23 at least to a level below the bottom of counterdoped region 30.

Approximately from $1\times10^{11}$ to $5\times10^{11}$ atoms of phosphorous per $cm^2$ ion-implanted are into the surface of substrate 23 to form a counterdoped region 30. N-type phosphorus impurities in counterdoped region 30 offset the P-type impurities of substrate 23 in that region. As a result, the resistivity of substrate 23 in counterdoped region is increased from 40 to 60 ohm.cm, before counterdoping, to over 200 ohm.cm after counterdoping. Thermal treatments diffuse the offset impurities in counterdoped region 30 to a depth of 2 to 10 microns, thereby extending the area of increased resistivity by the same distance into substrate 23.

An N+-type diffusion area 31, which acts as a cathode of photo diode 21, is formed on a portion of the surface of second epitaxial layer 25 of photo diode 21. The surface of second epitaxial layer 25 is covered by an oxidized membrane 32 which is etched to produce a plurality of contact holes, through which an aluminum cathode electrode 33 contacts N+-type diffusion area 31. An aluminum anode contact 34 extends through a contact hole in oxidized membrane 32 to contact the upper surface of separating area 26 which serves as a low-resistivity anode for photo diode 21.

An N+-type buried layer 35 spans the interface between first and second epitaxial layers 24, 25 of NPN transistor 22. A P-type base area 36 is formed in the surface of transistor 22. An N+-type emitter area 37 in the surface of base area 36. An N+-type collector contact area 38 of NPN transistor 22 are formed on the surface of transistor 22 outside base area 36.

An aluminum emitter contact 39 passes through oxidized membrane 32 to contact emitter area 37. An aluminum base contact 39' passes through oxidized membrane 32 to contact base area 36. An aluminum collector contact 39" passes through oxidized membrane 32 to contact a portion of the surface of second epitaxial area 25 within transistor 22, which serves as the collector of transistor 22.

The resulting device includes photo diode 21 capable of functioning as an optical signal input unit integrated with NPN transistor 22 which, together with the other circuit elements, can be used as part of a signal processing circuit.

Figure 2A:

An IC having the foregoing structure can be produced by the following process:

Referring to FIG. 2(A), a P-type silicon semiconductor substrate 23 with a surface direction of $<100>$ is P doped to a resistivity of 40 to 60 ohm.cm is prepared.

Figure 2B:
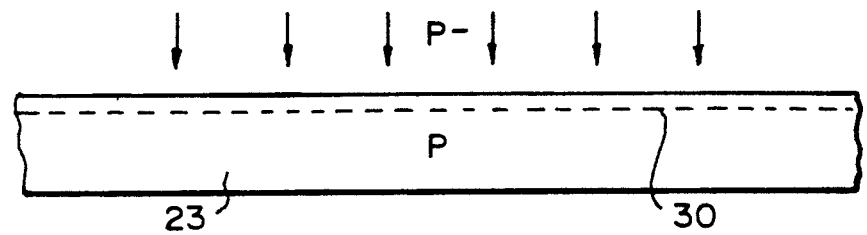

Referring to FIG. 2(B), the upper surface of substrate 23 is P counterdoped with phosphorus to a concentration of from $10^{11}$ to $5\times10^{11}$ atoms per $cm^2$ at about 40 KeV, thereby implanting impurities for forming counterdoped region 30. In one embodiment of the invention, the process of ion-implantation for forming counterdoped region 30 is carried out over substantially the entire surface area of substrate 23. In another embodiment of the invention, ion implantation at this stage is masked to occur only in the regions which will ultimately be below the area in which photo diode 21 will be formed.

Figure 2C:
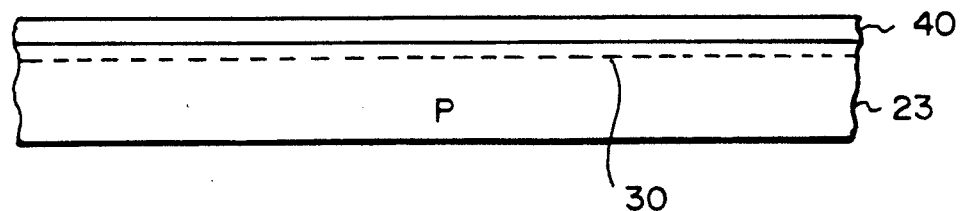

Referring to FIG. 2(C), substrate is heated in an oxygen atmosphere to develop an insulating oxide layer 40 of from 5000 to 7000 Angstroms thick on the surface of substrate 23.

Figure 2D:
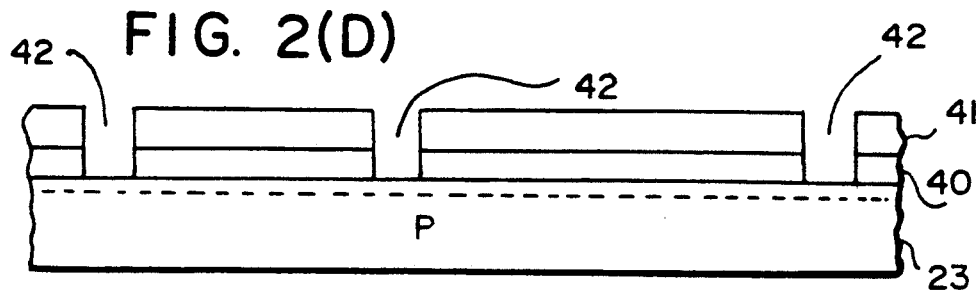

Referring to FIG. 2(D), oxide layer 40 is coated with a negative photo resist layer 41 by conventional means such as, for example, by spin coating. Photo resist layer 41 is baked, exposed and chemically etched by conventional HF etching to produce openings 42 through resist layer 41 and through the underlying oxide layer 40 to expose a corresponding pattern in the upper surface of substrate 23.

Figure 2E:
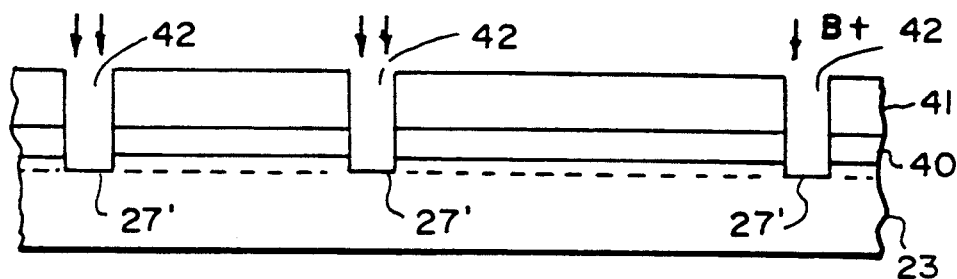

Referring now to FIG. 2(E), boron is ion implanted at about 80 KeV through openings 42 to a concentration of from $10^{14}$ to $10^{15}$ atoms/$cm^2$ to form precursors 27' of lower separating areas 27.

Figure 3A:
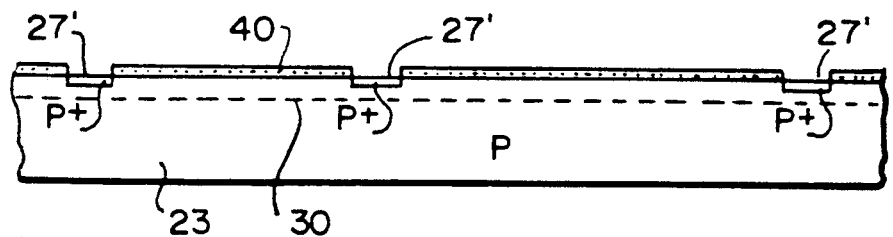

Referring now to FIG. 3(A), resist layer 41 is removed.

Figure 3B:
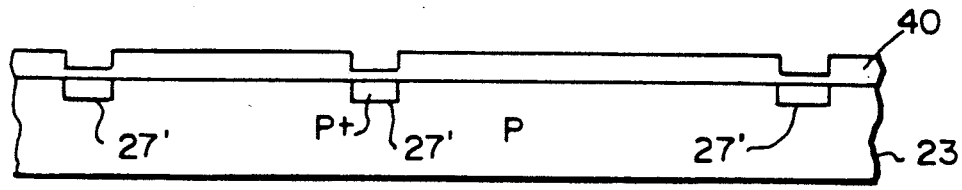

Referring now to FIG. 3(B), the device is heat treated at a temperature of about 1150° C. for one hour to partially diffuse precursor 27' into substrate 23.

Figure 3C:
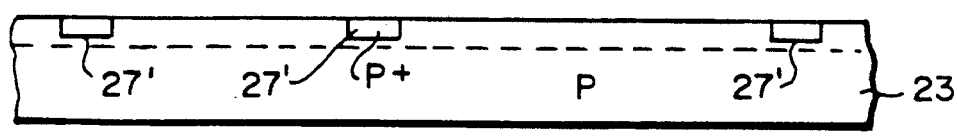

Referring now to FIG. 3(C), oxide layer 40 is removed using a solution of HF in preparation for following steps.

Figure 4A:
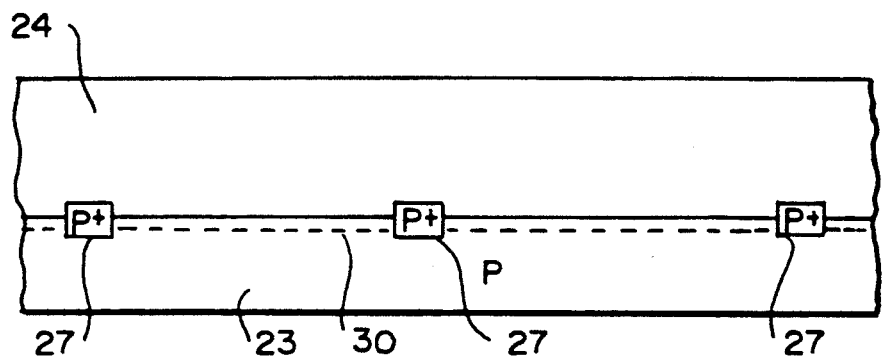

Referring to FIG. 4(A), substrate 23 is placed in an epitaxial growing device (not shown) and heated by a lamp at a temperature of approximately 1,140 C. SiH₂Cl₂ gas and H2 gas are introduced into a reaction tube, thus growing an epitaxial layer 24 of intrinsic material to a thickness of 15 to 20 microns. A small amount of autodoping of first epitaxial layer 24 takes place during growth by diffusion of boron P-type impurities from substrate 23 to yield a final epitaxial layer 24 having a relatively high resistivity of 200 to 1500 ohm.cm. Heat treatment during subsequent processing steps will cause further diffusion of impurities from substrate 23 into first epitaxial layer 24.

Autodoping of first epitaxial layer 24 in this manner produces an impurity concentration gradient in which the amount of impurities in first epitaxial layer 24 decreases with increasing distance from substrate 23.

If the concentration of impurities in the substrate 23 were to exceed a value giving a resistivity of 2 to 4 ohm.cm, a P-type area would be formed between substrate 23 and first epitaxial layer 24 with sufficient concentration to inhibit diffusion within the depletion layer. The present invention avoids this difficulty by employing a substrate 23 with a relatively high resistivity of 40 to 60 ohm.cm. Diffusion is minimized, thus preventing the formation of a P+ region which might interfere with circuit operation.

Figure 4B:
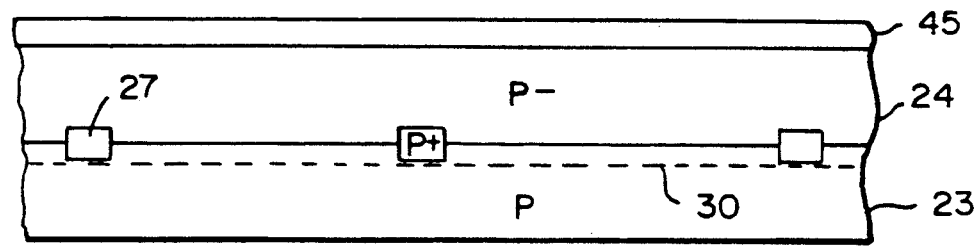

Referring to FIG. 4(B), the apparatus is heated in an oxygen-containing atmosphere to produce an insulating oxide layer 45 of from 5000 to 7000 Angstroms thick on the surface of first epitaxial layer 24.

Figure 4C:
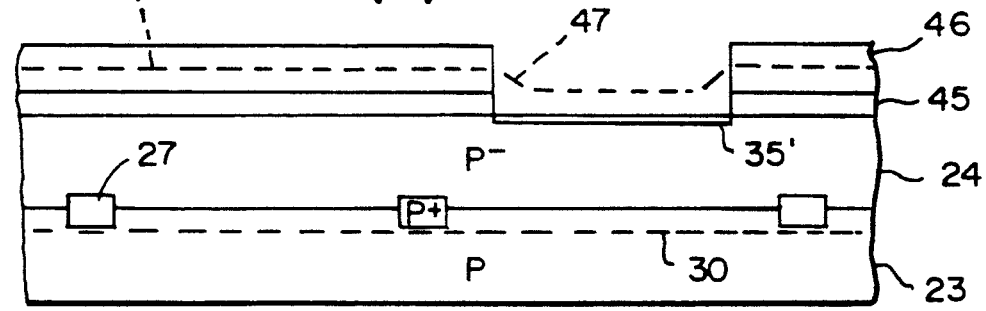

Referring to FIG. 4(C), a resist layer 46 is coated over oxide layer 45, baked, exposed and eched to produce an opening 47 through itself and through oxide layer 45 to expose a portion of the surface of first epitaxial layer 24. Resist layer 46 is removed and an antimony layer 48, shown in dashed line, is coated over the device, and especially in opening 47. The device is heat treated to diffuse a portion of the antimony into the surface of first epitaxial layer 24 to produce a precursor 35' of N+-type buried layer 35.

Figure 4D:
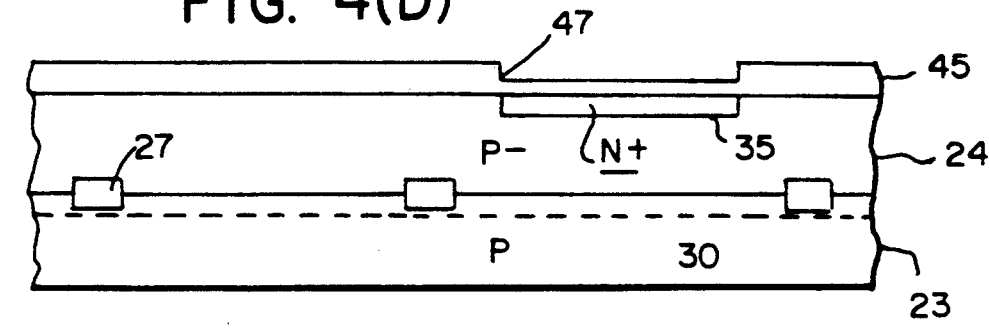

Referring to FIG. 4(D), antimony layer 48 is removed and the device is heat treated at 1200° C. for 30 minutes to redevelop oxide layer 45 over opening 47. This heat treatment also diffuses buried layer 35 downward into first epitaxial layer 24.

Referring to FIG. 5(A), a further resist layer 49 is coated over oxide layer 45, dried, exposed and etched with an HF solution to produce three openings 50 through itself and through oxide layer 45, thereby exposing three portions of the surface of first epitaxial layer 24.

Referring to FIG. 5(B), boron is ion implanted at 80 KeV through openings 50 at a concentration of $10^{14}$ to $10^{15}$ atoms.cm² to form a precursor 28' of middle separating area 28 of separating area 26.

Figure 5C:
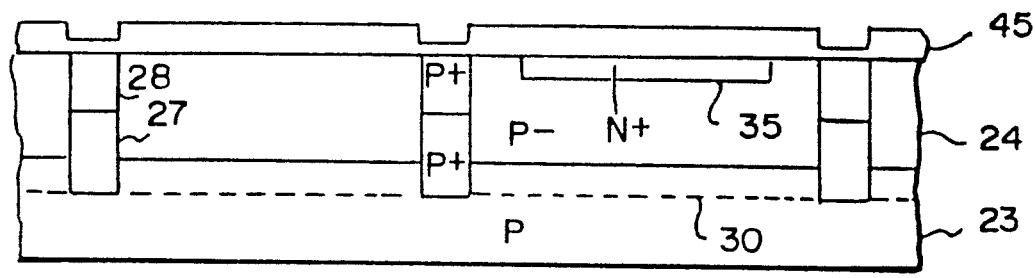

Referring to FIG. 5(C), resist layer 49 is removed, and the device is heat treated at a temperature of 1150° C. for from 4 to 5 hours to diffuse middle separating area 28 from 6 to 8 microns downward and to diffuse lower separating area 27 from 8 to 10 upward until they overlap to become a single entity.

Figure 6A:
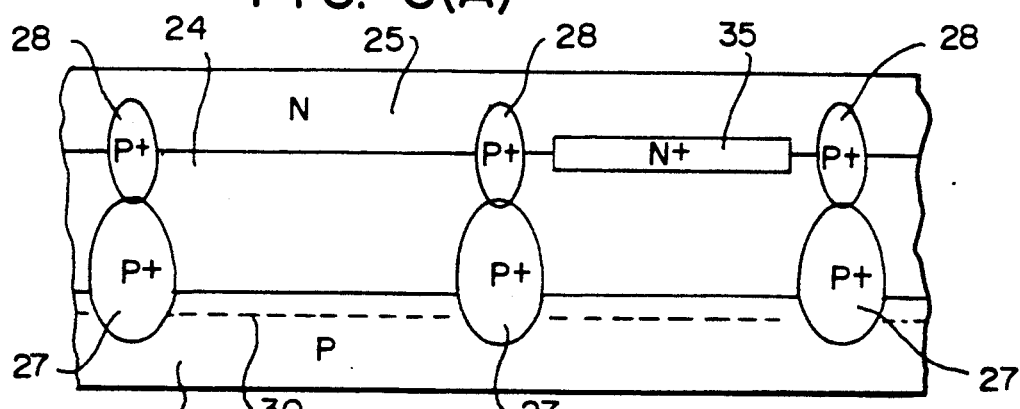

Referring to FIG. 6(A), oxide layer 45 is removed, and second epitaxial layer 25 is epitaxially grown to a thickness of 4 to 6 microns thick atop the surface of first epitaxial layer 24. Second epitaxial layer 24 is N doped using phosphorus in the gas from which it is grown.

Figure 6B:
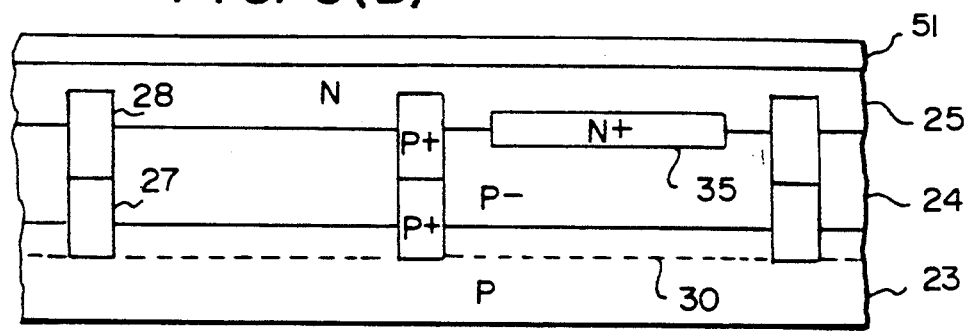

Referring to FIG. 6(B), the device is heated in an oxygen containing atmosphere to produce a further oxide layer 51, from 5000 to 7000 Angstroms thick, on the surface of second epitaxial layer 25.

Figure 6C:
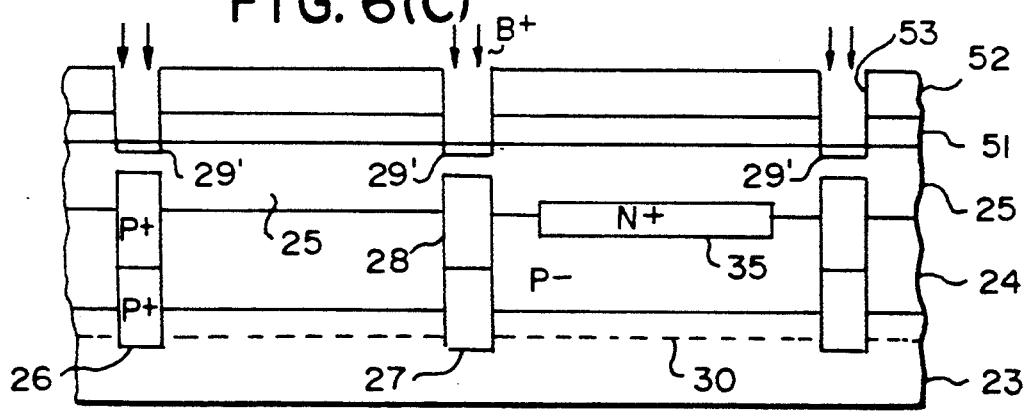

Referring to FIG. 6(C), a resist layer 52 is coated on oxide layer 51, baked, exposed and etched to produce openings 53 congruent with lower and middle separating areas 28 revealing the surface of second epitaxial area 25. Boron is ion implanted through openings 53 to produce precursors 29' for upper separating areas 29.

Figure 6D:
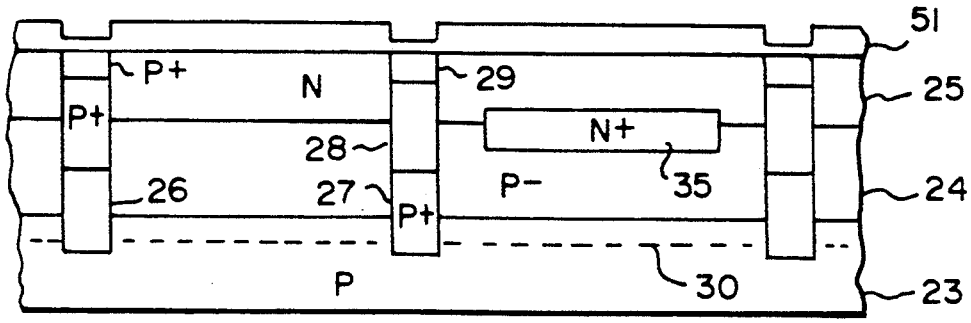

Referring to FIG. 6(D), the resist layer 52 is removed and the assembly is heat treated at about 1000° C. for 1 to 2 hours to diffuse the boron forming upper separating areas 29 about 1 to 3 microns downward, and to diffuse middle separating areas 28 about 4 to 5 microns so that these two separating areas overlap and join with lower separating areas 27 to form unified separating areas from a distance below the surface of substrate 23 to the upper surface of second epitaxial layer 25.

Figure 7A:
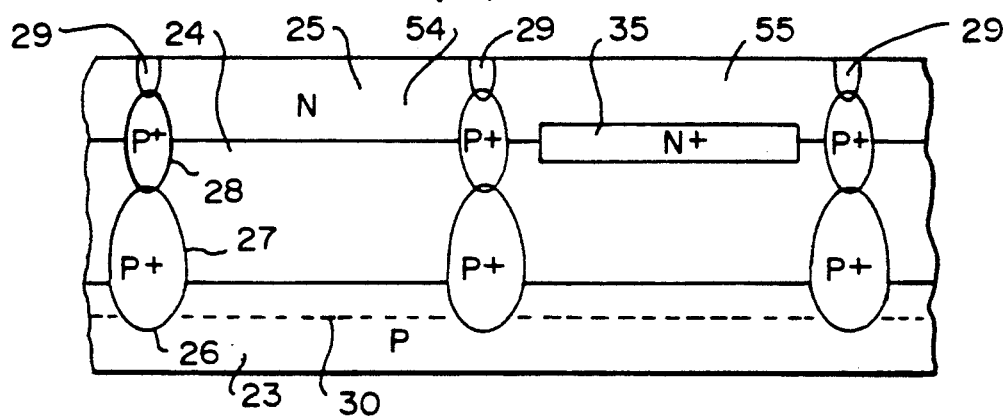

Referring to FIG. 7(A), the oxide layer 51 is removed to produce the intermediate product shown. It should be noted that lower separating area 27 extends below counterdoped region 30, whereby first and second isolated islands 54 and 55 are isolated by separating areas 26 extending the entire distance from the top surface second epitaxial layer 25 to below the bottom of counterdoped region 30.

Figure 7B:
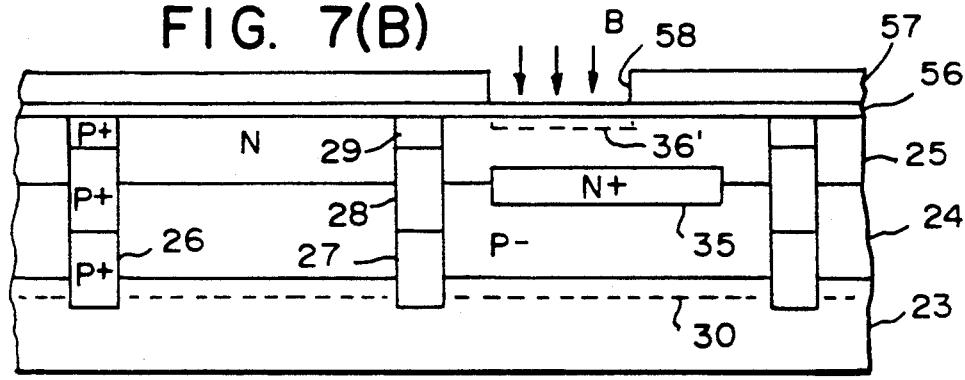

Referring to FIG. 7(B), an oxide layer 56, from 400 to 600 Angstroms thick, is formed on the surface of second epitaxial layer 25 and is coated with a resist layer 57. Resist layer 57 is baked, exposed and etched to form an opening 58 therethrough and through oxide layer 56 to reveal a portion of the surface of second epitaxial layer 25. Boron is ion implanted at 40 KeV through opening 58 to a concentration of $10^{14}$ to $10^{16}$ atoms/cm² to form a precursor 36' of base area 36.

Figure 7C:
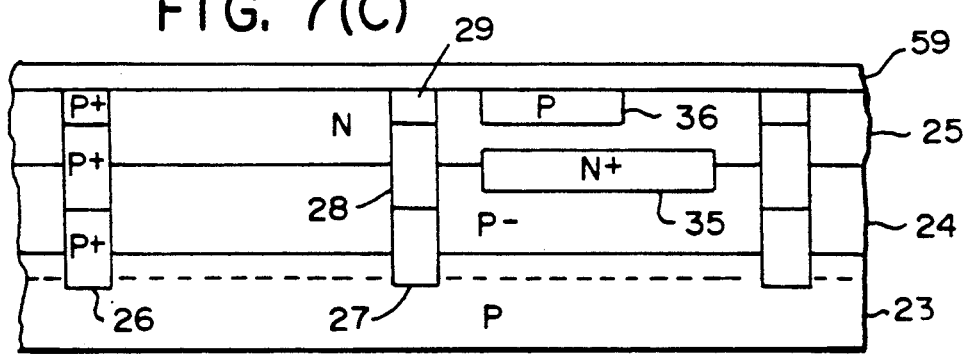

Referring to FIG. 7(C), resist layer 57 is removed and the device is heat treated at about 1100° C. from 1-2 hours to diffuse downward the boron in precursor 36', thereby forming base area 36. During this heat treatment, a further oxide layer 59 is developed on the surface of second epitaxial layer 25.

Figure 7D:
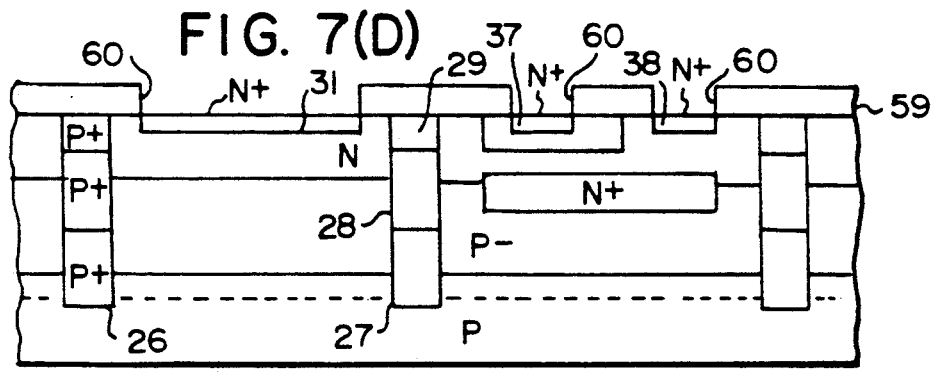

Referring to FIG. 7(D), a resist layer (not shown) is deposited, and etched to form openings 60 in oxide layer 59. A phosphorus layer (not shown) is coated over oxide layer 59 and the device is baked to diffuse some of the phosphorus into portions of the surface of second epitaxial layer 25 corresponding to openings 60. The phosphorus layer is removed and the assembly is baked to diffuse diffusion area 31, emitter area 37 and collector contact area 38 downward.

Returning to FIG. 1, oxide layer 59 is removed, and is replaced with oxidized membrane 32 to accommodate electrodes 33, 39, 39' and 39" contacting elements below them. Electrodes 33, 39, 39' and 39", as well as interconnection wiring (not shown), are preferably formed by evaporation coating of aluminum-silicon alloy, about 1 to 2 microns thick, atop oxide membrane 32, and etching away unwanted portions.

Variations of the above process may be employed without departing from the spirit and scope of the invention. For example, instead of forming upper separating areas 29 in separate steps, etching and boron implantation for these elements may be performed during the formation of base area 36. That is, the portion of the process shown in FIG. 7(B) may be changed to include the formation of openings for the implantation of boron to form upper separating areas 29, at the same time that the opening 58 is formed for the implantation of boron to form base area 36.

Operation of photo diode 21 will be discussed hereinafter.

When a Vcc potential of e.g. 5 V is applied to cathode electrode 33, and anode electrode 34 is grounded (GND), the resulting reverse bias creates a depletion region about the boundary between first and second epitaxial layers 24, 25 of photo diode 21. Since first epitaxial layer 24 is epitaxially grown from intrinsic material, and is only lightly autodoped during growth and subsequent fabrication steps, first epitaxial layer 24 has a high resistivity. This high resistivity places the depletion region mainly within first epitaxial layer 24.

Ion-implanted offset impurities in counterdoped region 30, which diffused from the surface of substrate 23 during thermal treatment, increase the resistivity of the portion of substrate 23 in counterdoped region 30 to over 200 ohm.cm. to a depth of 2 to 10 microns below the surface of substrate 23. This enlarges the depth of the depletion region beyond the lower extremity of first epitaxial layer 24 to the depth of counterdoped region 30 in substrate 23.

As a result of the above expansion, the depth of the depletion region equals the sum of the diffusion in second epitaxial layer 25 from the foregoing boundary, the diffusion in first epitaxial layer 24, and the diffusion extending to the depth of counterdoped region 30 of substrate 23, a total of 25 to 35 microns. The junction capacitance of photo diode 21 decreases with an increase in the depth of the depletion region. As a result, this invention is able to produce high speed responses.

According to this invention, the impurities (boron) in substrate 23 forms a P-type region in first epitaxial layer 24 by autodoping during epitaxial growth and during subsequent thermal treatment. Since first epitaxial layer is intrinsic, however, the concentration of impurities in this P-type region remains low. This effect is accentuated by the relatively low concentration of impurities (40 to 60 ohm.cm) within substrate 23.

As offset impurities implanted to form counterdoped region 30, in addition to diffusing downward into substrate 23, also diffuse upward into first epitaxial layer 24. They offset the impurities that diffuse into first epitaxial layer 24 and thus offset some of the impurities entering first epitaxial layer due to autodoping. Accordingly, the threshold concentration of impurities necessary to interfere with diffusion within the depletion region is never reached.

When first epitaxial layer 24 is grown, the boron which enters it from substrate 23 or first separating area 27 may unite with silicon atoms or be deposited, thereby changing first epitaxial layer 24 into a P-type region near substrate 23. However, since second epitaxial layer 25 is N-type, a PIN junction or a PN junction, suitable for the formation of a deep depletion layer, is easily formed.

The overall depth of the depletion region of photo diode 21 is thicker than first epitaxial layer 24. As a result, the absorption efficiency of the depletion region for incident light is high. A corresponding decrease in the ratio of carriers occurring in the depth of photo diode 21 increases the operating speed.

The carriers produced by incident light travel to anode electrode 34 through separating area 26, which has a of low resistivity. This low contact resistivity provides low series resistance for photo diode 21. On the cathode side, the low resistivity of $N^+$-type diffusion area 31 provides direct removal of charges, thereby even further reducing the series resistance.

As discussed above, according to this invention, the growth of intrinsic first epitaxial layer 24 provides a relatively thick depletion region in first epitaxial layer 24. The offset impurities in counterdoped region 30 allow the depletion region to expand into substrate 23. This produces a low junction capacitance and increases the light absorption ratio. This, in turn, prevents liberation of carriers outside depletion region. Thus, this invention provides a very high speed response photo diode 21.

Since separating area 26, which has a high concentration of impurities and a consequent low resistivity, extends well into substrate 23, the series resistance of photo diode 21 is greatly reduced. Since photo diode 21 is completely isolated from NPN transistor 22 by separating area 26, which extends from the surface of second epitaxial layer 25 to below the bottom of counterdoped region 30 in substrate 23, isolation between photo diode 21 and transistor 22 is so complete that, when these elements are built into a circuit, no parasitic effects are produced by interaction between them.

First epitaxial layer 24 is grown from intrinsic materials, being lightly doped by autodoping during growth and subsequent processing. It is unnecessary to control the concentration of impurities during growth and simple to obtain high resistivity in this layer. Since only intrinsic material is used to grow epitaxial layer, the vessel in which the epitaxial layer is grown does not become contaminated by a large quantity of boron, as is the case with the prior-art process. Since the vessel is not contaminated with large quantities of boron during epitaxial growth of first epitaxial layer 24, it is not necessary to physically remove the apparatus from the vessel in order to begin the growth of N-type epitaxial layer 25. This reduces maintenance on the device.

Since separating area 26 is formed by lower separating area 27, which diffuses upward to join middle separating area 28, which grows downward, the amount by which middle separating area 28 must be diffused is reduced, compared to the prior art. Accordingly, middle separating area 28 can be shallower, and thereby with less horizontal diffusion than is the case with corresponding elements in the prior art. Thus, less horizontal space is taken by middle separating area, and the total real estate occupied by NPN transistor 22 can be relatively small.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An optical semiconductor device comprising:
   a semiconductor substrate of a first conductivity type;
   a first epitaxial layer epitaxially grown of intrinsic material on a surface of said semiconductor substrate;
   a second epitaxial layer of a second conductivity type epitaxially grown on a surface of said first epitaxial layer;
   a separating area of said first conductivity type dividing said first and second epitaxial layers into at least first and second island areas;

said separating area including a lower separating area, a middle separating area and an upper separating area, all congruent and joined together;

said lower separating area being diffused upward from a surface of said substrate;

said upper separating area being diffused downward from a surface of said second epitaxial layer;

said middle separating area being centered in an interface between said first and second epitaxial layers, being diffused downward to connect to said lower separating area, and being diffused upward to connect to said upper separating area;

a diffusion area of said second conductivity in a surface of said second epitaxial layer in said first island area;

a first electrode of a photo diode contacting said diffusion area;

a second electrode of said photo diode contacting said separating area;

a buried layer of said second conductivity at an interface between said first and second epitaxial layers in said second island area; and a base area of said first conductivity type on an upper surface of said second epitaxial layer in said second island area; and an emitter area of said second conductivity type in an upper surface of said base area.

2. An optical semiconductor device according to claim 1 in which said semiconductor substrate has a resistivity of 40 to 60 ohm.cm.

3. An optical semiconductor device according to claim 1, in which at least a portion of said first epitaxial layer has a resistivity of 200 to 1500 ohm.cm.

4. An optical semiconductor device according to claim 1 in which said diffusion area and said emitter area are formed during the same process steps.

5. An optical semiconductor according to claim 1 in which said base area and said upper separating area are formed in the same process steps.

6. An optical semiconductor device comprising:
a semiconductor substrate of a first conductivity type;
a first epitaxial layer epitaxially grown of intrinsic semiconductor material on a surface of said semiconductor substrate;
a second epitaxial layer of a second conductivity type epitaxially grown on a surface of said first epitaxial layer;
a separating area of said first conductivity type dividing at least a portion of said substrate and said first and second epitaxial layers into at least first and second island areas;
offsetting impurities of said second conductivity type for offsetting a concentration of impurities in said semiconductor substrate at least in said first island to produce a counterdoped layer;
a diffusion area of said second conductivity type of a photo diode in a surface of said first island area;
a first electrode of said photo diode contacting said diffusion area;
a second electrode of said photo diode contacting said separating area;
a buried layer of said second conductivity type at an interface between said first and second epitaxial layers in at least one of said first and second island areas; and
a base area of said first conductivity type in a surface of said second island area;
an emitter area of said second conductivity type in a surface of said base area.

7. An optical semiconductor device according to claim 6 in which said semiconductor substrate has a resistivity of 40 to 60 ohm.cm.

8. An optical semiconductor device according to claim 6, in which at least a portion of said first epitaxial layer has a resistivity of 200 to 1500 ohm.cm.

9. An optical semiconductor device according to claim 6 in which said diffusion area and said emitter area are formed during the same process steps.

10. An optical semiconductor device according to claim 6, in which said offsetting impurities are introduced into a surface of said semiconductor substrate.

11. An optical semiconductor device according to claim 6, in which said offsetting impurities are selectively introduced into a surface of said substrate only in said first island area.

12. An optical semiconductor device according to claim 6, wherein said separating area is diffused downward into said substrate at least as far as said offsetting impurities extend into said substrate.

13. An optical semiconductor device comprising:
a semiconductor substrate of a first conductivity type;
a first epitaxial layer epitaxially grown of intrinsic semiconductor material on a surface of said semiconductor substrate;
a second epitaxial layer of said second conductivity type epitaxially grown on a surface of said first epitaxial layer;
a separating area of said first conductivity type dividing at least a portion of said substrate and said first and second epitaxial layers into at least first and second island areas;
offsetting impurities of said second conductivity type for offsetting a concentration of impurities in said semiconductor substrate at least in said first island to produce a counterdoped layer;
said separating area including a lower separating area, a middle separating area and an upper separating area;
said lower separating area being diffused from the surface of said substrate into said first epitaxial layer;
said middle separating area being diffused downward to unite with said lower separating area and in an upward direction from an interface between said first and second epitaxial layers;
said upper separating area being diffused downward from a surface of said second epitaxial layer to unite with said middle separating area; a diffusion area of said second conductivity type of a photo diode in a surface of said first island area;
a first electrode of said photo diode contacting said diffusion area;
a second electrode of said photo diode contacting said separating area;
a buried layer of said second conductivity type at an interface between said first and second epitaxial layers in said second island areas; and
a base area of said first conductivity type in a surface of said second island area;
an emitter area of said second conductivity type in a surface of said base area.

14. An optical semiconductor device according to claim 13 in which said semiconductor substrate has a resistivity of 40 to 60 ohm.cm.

15. An optical semiconductor device according to claim 13, in which at least a portion of said first epitaxial layer has a resistivity of 200 to 1500 ohm.cm.

16. An optical semiconductor device according to claim 13 in which said diffusion area and said emitter area are formed during the same process steps.

17. An optical semiconductor device according to claim 13, in which said offsetting impurities are introduced into a surface of said semiconductor substrate.

18. An optical semiconductor device according to claim 13, in which said offsetting impurities are selectively introduced into a surface of said substrate only in said first island area.

* * * * *